(12) United States Patent
Kotani et al.

(10) Patent No.: US 6,388,363 B1
(45) Date of Patent: May 14, 2002

(54) PIEZOELECTRIC RESONATOR (75) Inventors: Kenichi Kotani; Masakazu Yoshio, both of Toyama-ken (JP)

(73) Assignee: Murata Manufacturing, Ltd., Kyoto (JP)

( * ) Notice: Subject to any disclaimer, the term of this patent is extended or adjusted under 35 U.S.C. 154(b) by 0 days.

(21) Appl. No.: 09/710,993

(22) Filed: Nov. 10, 2000

(30) Foreign Application Priority Data

Nov. 15, 1999 (JP) .......................................... 11-324152

(51) Int. Cl.$^7$ ............................................... H01L 41/08
(52) U.S. Cl. ...................................... 310/320; 310/366
(58) Field of Search ............................ 310/320, 365, 310/366

(56) References Cited

U.S. PATENT DOCUMENTS

| | | | |
|---|---|---|---|
| 4,565,942 A | * 1/1986 | Sakai et al. | 310/320 |
| 4,833,430 A | * 5/1989 | Roberts et al. | 310/320 |
| 4,870,313 A | * 9/1989 | Hirama et al. | 310/320 |
| 5,121,024 A | * 6/1992 | Seto | 310/320 |
| 5,166,570 A | * 11/1992 | Takahashi | 310/320 |
| 6,011,451 A | * 1/2000 | Gamo | 333/189 |

FOREIGN PATENT DOCUMENTS

| | | | | |
|---|---|---|---|---|
| JP | 52-53690 A | * 4/1977 | | 310/320 |
| JP | 62-277808 A | * 12/1987 | | 310/365 |
| JP | 3-139009 A | * 6/1991 | | 310/365 |
| JP | 3-79528 | 8/1991 | | H03H/9/02 |
| JP | 4-129314 A | * 4/1992 | | 310/365 |
| JP | 4-119123 | 10/1992 | | H03H/9/17 |
| JP | 63-244916 A | * 10/1998 | | 310/365 |

* cited by examiner

Primary Examiner—Thomas M. Dougherty
(74) Attorney, Agent, or Firm—Keating & Bennett, LLP (57) ABSTRACT

A small and easily produced piezoelectric resonator, which effectively damps unwanted vibration and utilizes intended vibration includes excitation electrodes provided on both main surfaces of a piezoelectric substrate, and first and second lead-out electrodes and first and second terminal electrodes electrically connected to the excitation electrodes, respectively. At least one of the terminal electrodes includes an electrode extension portion arranged to extend into the imaginary region where the first and second excitation electrodes are extended to at least one of the side edges of the piezoelectric substrate.

18 Claims, 10 Drawing Sheets

PIEZOELECTRIC RESONATOR

BACKGROUND OF THE INVENTION

1. Field of the Invention

The present invention relates to an energy-trap type piezoelectric resonator, and more particularly to a piezoelectric resonator which effectively utilizes the resonance characteristics based on desired vibration while suppressing the generation of unwanted vibration that produces spurious responses.

2. Description of the Related Art

Conventionally, an energy-trap type piezoelectric resonator has been widely used in piezoelectric oscillators and other devices. In this kind of piezoelectric resonator, since vibration other than the desired vibrational mode produces spurious responses, it is essential to suppress the generation of unwanted vibration.

Conventional devices have attempted to damp unwanted vibration. For example, Japanese Unexamined Utility Model Publication No. 4-119123 discloses an energy-trap type piezoelectric resonator including damping materials provided in island elements at the end portions of a piezoelectric substrate, adjacent to a resonance section.

Figure 13:
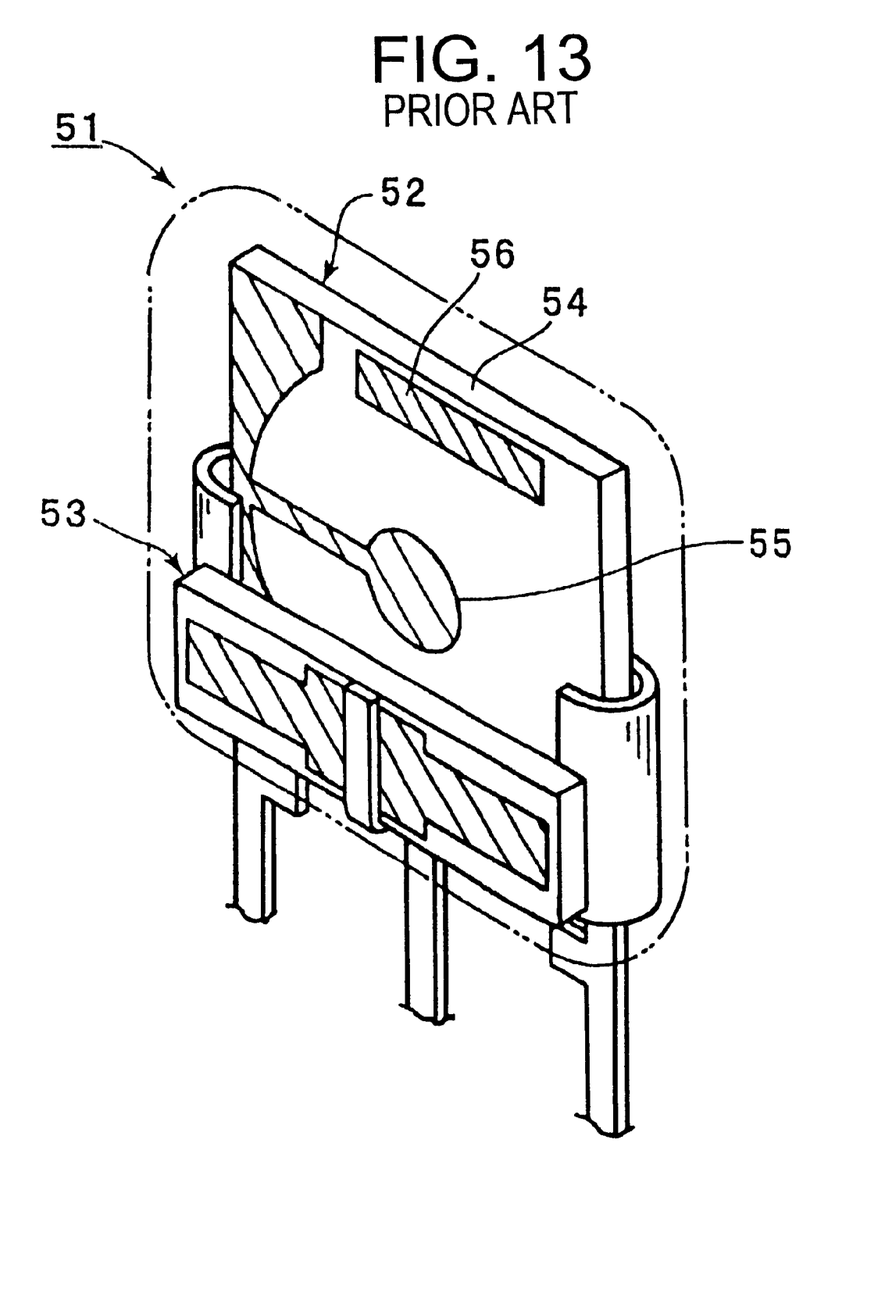
FIG. 13 is a schematic perspective view for explaining an example of a conventional piezoelectric resonator.

Also, Japanese Unexamined Utility Model Publication No. 3-79528 discloses a load capacitor incorporating piezoelectric oscillator shown in FIG. 13. A piezoelectric oscillator 51 includes a piezoelectric resonator 52, and a capacitor 53 for providing a load capacitor. The piezoelectric resonator 52 is constructed of a piezoelectric substrate 54 with a rectangular plate shape. At the central portions of both main surfaces of the piezoelectric substrate 54, excitation electrodes 55 are arranged to be opposed to each other via the piezoelectric substrate 54. This section including the excitation electrodes 55 opposed to each other via the substrate on the top and bottom surfaces constitutes an energy-trap type resonance section. A damping electrode 56 is located above this resonance section in the vicinity of a side surface 54a of the piezoelectric substrate 54. By providing soldering on the damping electrode 56, unwanted vibration is damped.

In an energy-trap type resonator, the relationship between the resonance section and the damping material is very important. That is, if the position of the damping material is improper, the desired main vibration is damped, or the damping of unwanted vibration is not achieved.

In the conventional art disclosed in Japanese Unexamined Utility Model Publication No. 4-119123, a damping material is disposed only at the end portion of the piezoelectric substrate at a specified distance from the resonance section of the piezoelectric substrate, but it is very difficult to accurately position such a damping material. This conventional piezoelectric resonator, therefore, is very difficult to produce, experiences failures due to the misalignment of damping material. Also, the damping material disposed in island elements causes another problem in that cracks are often produced in the piezoelectric substrate when applying the damping material or on the processing line thereafter. In addition, the difficulty in accurately disposing the damping material makes it difficult to reduce the size of the piezoelectric resonator.

In the piezoelectric oscillator disclosed in the Japanese Unexamined Utility Model Publication No. 3-79528, the damping electrode 56 provided on the piezoelectric substrate 54 is very small. Therefore, it is difficult to apply solder on the damping electrode 56. To accurately apply the solder, it is necessary to enlarge the area of the electrode for damping 56, which also makes size-reduction of the piezoelectric resonator 52 difficult.

SUMMARY OF THE INVENTION

To overcome the above-described problems, preferred embodiments of the present invention provide a much smaller and easily produced energy-trap type piezoelectric resonator, which effectively damps unwanted vibration and utilizes intended vibration, and which facilitates external electrical connections.

The piezoelectric resonator in accordance with preferred embodiments of the present invention includes a piezoelectric substrate, first and second excitation electrodes partially provided on the first and second main surfaces of the piezoelectric substrate, respectively, and opposed to each other via the first and second excitation electrodes on the top and bottom surfaces, first and second lead-out electrodes electrically connected to the first and second excitation electrodes, respectively, and provided on the first and second main surfaces of the piezoelectric substrate, respectively, and first and second terminal electrodes for establishing external connections with the outside provided at the end portions of the respective first and second lead-out electrodes, the end portions being opposed to the sides where the respective first and second excitation electrodes are connected. At least one of the first and second terminal electrodes has an electrode extension portion arranged to extend into the imaginary region where the first and second excitation electrodes are extended to at least one of the side edges of the piezoelectric substrate.

Preferably, the mean normal-line distance from the outer peripheral edge of the excitation electrode to the inside edge of the electrode extension portion is at least about 1.2d, where d is the diameter of the excitation electrode.

More preferably, soldering is provided on the electrode extension portion. In this case, soldering is provided over the entire upper surfaces of the terminal electrodes.

The piezoelectric resonator in accordance with preferred embodiments of the present invention also may preferably include first and second lead terminals soldered to the respective first and second terminal electrodes by soldering, thereby providing a piezoelectric resonator with leads.

Other features, elements, steps, characteristics and advantage of the present invention will become more apparent from the following detailed description of preferred embodiments thereof with reference to the attached drawings.

DETAILED DESCRIPTION OF PREFERRED EMBODIMENTS

Figure 1:
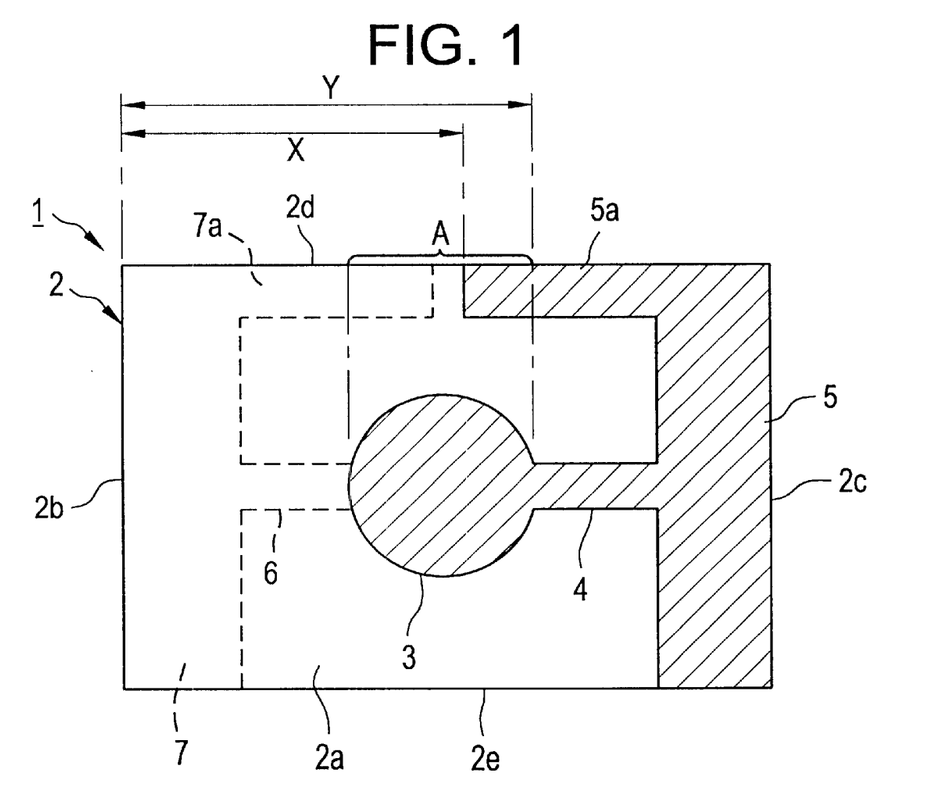
FIG. 1 is a plan view showing a piezoelectric resonator in accordance with a first preferred embodiment of the present invention.

In FIG. 1, an energy-trap type piezoelectric resonator in accordance with a first preferred embodiment of the present invention is shown. The piezoelectric resonator 1 is a piezoelectric resonator utilizing a third harmonic of a thickness vertical vibration, and has a piezoelectric substrate 2 having a substantially rectangular plate shape. The piezoelectric substrate 2 is preferably constructed of a piezoelectric ceramic such as a lead titanate zirconate-based ceramic, or a piezoelectric single crystal such as quartz. In the present preferred embodiment, the piezoelectric substrate 2 is constructed of a piezoelectric ceramic, and is polarized in the thickness direction.

At the approximately central portion of the upper surface 2a of the piezoelectric substrate, a excitation electrode 3 having a substantially circular shape is provided. A lead-out electrode 4 is connected to the excitation electrode 3. A terminal electrode 5 is connected to the outer end portion of the lead-out electrode 4. The terminal electrode 5 is provided on the upper surface 2a of the piezoelectric substrate 2 and extends along the edge defined by an end surface 2c and the upper surface, covering the entire width of the piezoelectric substrate 2. The direction crossing the side surfaces 2d and 2e of the piezoelectric substrate 2 is defined as the width direction.

Moreover, the terminal electrode 5 is not only configured to cover the entire width of the piezoelectric substrate 2, but is also extended toward the end surface 2b side in the longitudinal direction, that is, in the direction crossing the end surfaces 2b and 2c, along the edge formed by the side surface 2d and the upper surface 2a.

This portion extended toward the end surface 2b side is hereinbelow referred to as "electrode extension portion 5a".

The electrode extension portion 5a is configured to extend into the imaginary region (the region indicated by A in the figure) when the excitation electrode 3 is extended toward the side surface 2d side.

Also on the lower surface of the piezoelectric substrate 2, the other excitation electrode is arranged to be opposed to the excitation electrode 3 via the piezoelectric substrate 2. A lead-out electrode 6 is connected with the excitation electrode provided on the lower surface, and a terminal electrode 7 is connected with the outer end portion of the lead-out electrode 6. The terminal electrode 7 is preferably constructed in the same manner as the terminal electrode 5. The terminal electrode 7 is provided along the length of the edge defined by the lower surface and the end surface 2b of the piezoelectric substrate 2. The terminal electrode 7 also includes an electrode extension portion 7a, which is extended along the edge defined by the lower surface and the side surface 2a of the piezoelectric substrate 2, and is configured to extend into the above-mentioned imaginary region A.

One of the novel features of preferred embodiments of the piezoelectric resonator 1 of this preferred embodiment is that the electrode extension portions 5a and 7a are arranged to extend into the imaginary region A.

In other words, the electrode extension portion 5a is configured such that the distance X between the tip end of the electrode extension portion 5a of the terminal electrode 5 and the side surface 2b opposed to the side where the terminal electrode 5 is provided, is less than the distance Y between the end portion of the excitation electrode 3 and the end surface 2b, the end portion being adjacent to the terminal electrode 5.

In this preferred embodiment, since the electrode extension portion 5a is arranged to extend into the imaginary region A, unwanted vibration is effectively damped. This will now be described below in accordance with specific experimental examples.

As the piezoelectric substrate 2, a piezoelectric substrate was prepared which was constituted of a PT-based ceramic and which had an approximate size of 2.35 mm (width)×3.6 mm (length)×0.47 mm (thickness). On both main surfaces of this piezoelectric substrate 2, the excitation electrodes 3 having a diameter d of about 1.4 mm, and lead-out electrodes 4 and 6 and terminal electrodes 5 and 7 shown in FIG. 1 were provided. In this case, the electrode extension portions 5a and 7a of the respective terminal electrodes 5 and 7 had dimensions of about 0.15 mm (width)×0.9 mm (length), and was configured such that a portion of each of the electrode extension portions 5a and 7a extends into the imaginary region A.

For comparison, a piezoelectric resonator was prepared which was constructed in the same manner as the foregoing except that this piezoelectric resonator was not provided with the above-described electrode extension portions.

Figure 2A:
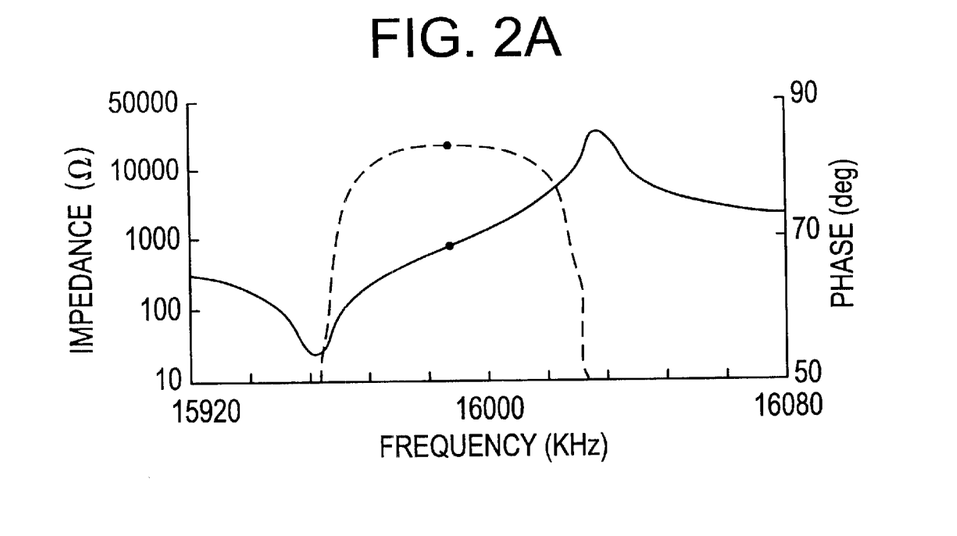
FIGS. 2A and 2B are diagrams showing the resonance characteristics of the piezoelectric resonators of the first preferred embodiment of the present invention and a comparative example.
Figure 2B:
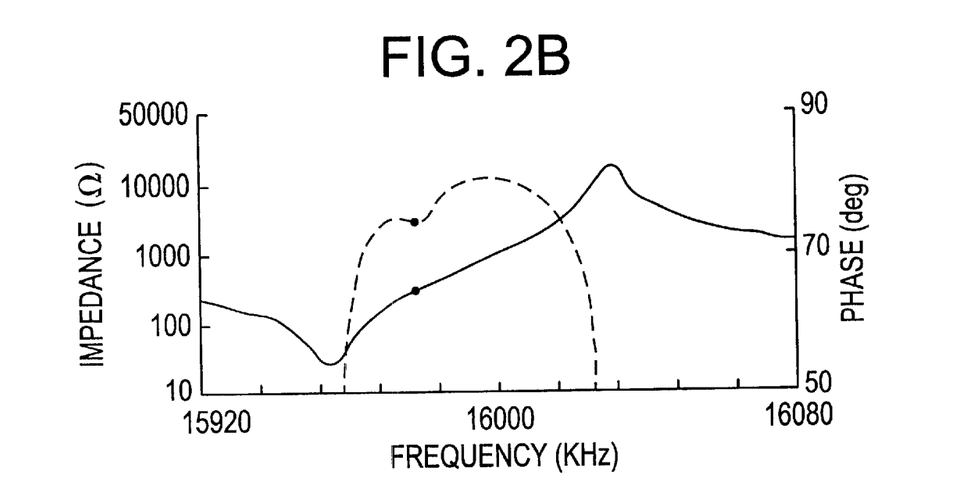

The impedance-frequency characteristics of the above-described preferred embodiment and comparative example were measured. The results are shown in FIGS. 2A and 2B. In FIG. 2A, the solid line represents the impedance-frequency characteristics of the piezoelectric resonator of the preferred embodiment of the present invention, and the broken line represents the phase-frequency characteristics thereof, each for this preferred embodiment of the present invention. FIG. 2B exhibits the impedance-frequency characteristics (solid line) and the phase-frequency characteristics (broken line) of the piezoelectric resonator of the comparative example. As can be seen from FIGS. 2A and 2B, the unique arrangement of the electrode extension portion 5a and 7a produces highly effective suppression of the width spurious responses that occur in the piezoelectric resonator of the comparative example.

In the piezoelectric resonator of the present preferred embodiment, by arranging the electrode extension portions 5a and 7a for the terminal electrodes as described above, unwanted vibration is damped. In this case, the electrode extension portions 5a and 7a are provided as portions of the terminal electrodes 5 and 7, respectively, in the same process as that of the terminal electrodes 5 and 7. Therefore, no extra processes are required to provide damping material. Furthermore, electrode material can be provided on the piezoelectric substrate with a high accuracy by screen printing, photolithography, or other suitable method. This allows the electrode extension portions 5a and 7a to be accurately provided, which results in reliable damping of unwanted vibration.

Meanwhile, in the present preferred embodiment, width spurious responses are suppressed by utilizing a thickness vertical vibration mode of the third harmonic, but the vibration mode used in the piezoelectric resonator in accordance with the present invention, is not particularly limited to this mode. Another vibration mode such as a thickness sliding mode may be utilized. Also, not only a third harmonic, but also other harmonics may be used, or even a fundamental wave may be used.

In the piezoelectric resonator 1 of the first preferred embodiment, although the electrode extension portions 5a and 7a are provided, the electrode extension portion may be located on at least one main surface alone. Also, the shape of the terminal electrode 5 and 7 may be widely varied as shown in FIGS. 3 through 7.

Figure 3:
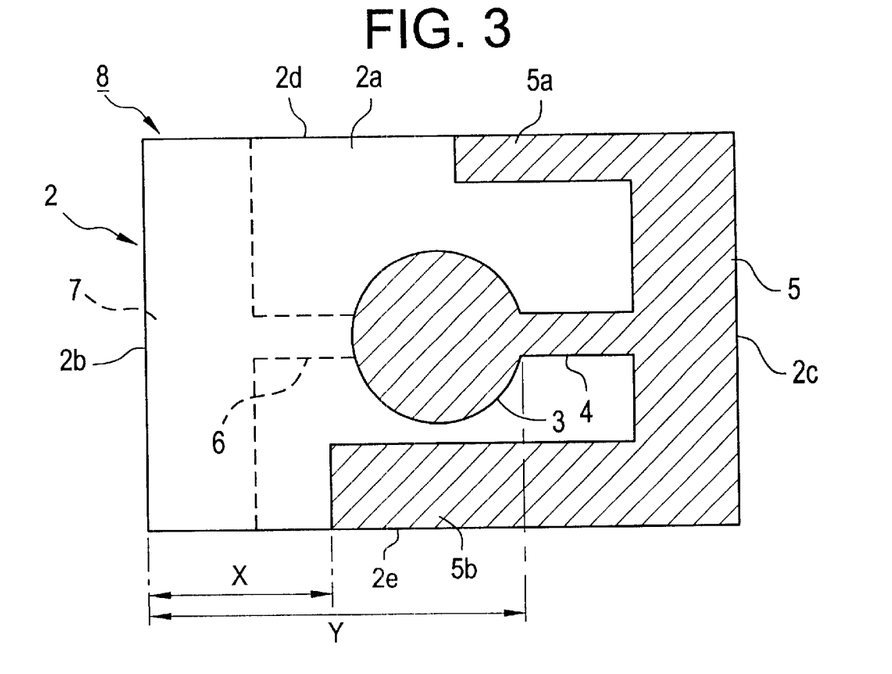
FIG. 3 is a plan view showing a modified example of the piezoelectric resonator of the first preferred embodiment of the present invention.

In a piezoelectric resonator 8 shown in FIG. 3, a terminal electrode 7 is not provided with an electrode extension portion. On the other hand, in a terminal electrode 5, an electrode extension portion 5a is provided along the side surface 2d, as in the case of the piezoelectric resonator 1 of the first preferred embodiment. In addition, a second electrode extension portion 5b is provided along the edge formed by the side surface 2e and the upper surface 2a. The second electrode extension portion 5b is also configured to meet the above-mentioned size condition: Y>X.

Figure 4:
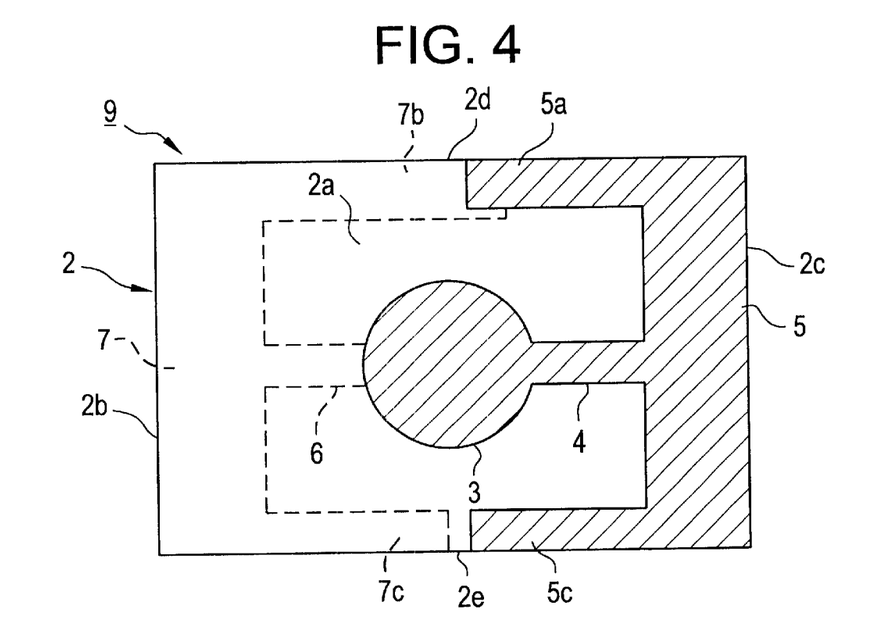
FIG. 4 is a plan view showing another modified example of the piezoelectric resonator of the first preferred embodiment of the present invention.

In a piezoelectric resonator 9 shown in FIG. 4, electrode extension portions 5a and 5c are provided for the terminal electrode 5, and electrode extension portions 7b and 7c are provided to the terminal electrode 7. The electrode extension portion 5c is preferably configured in the same manner as the electrode extension portions 5a, and is provided along the edge defined by the side surface 2e and the upper surface 2a. The electrode extension portions 7b is configured so that the tip end thereof overlaps with that of electrode extension portions 5a via the piezoelectric substrate 2. The electrode extension portions 7c is preferably provided in the same manner as the electrode extension portions 5c.

Figure 5:
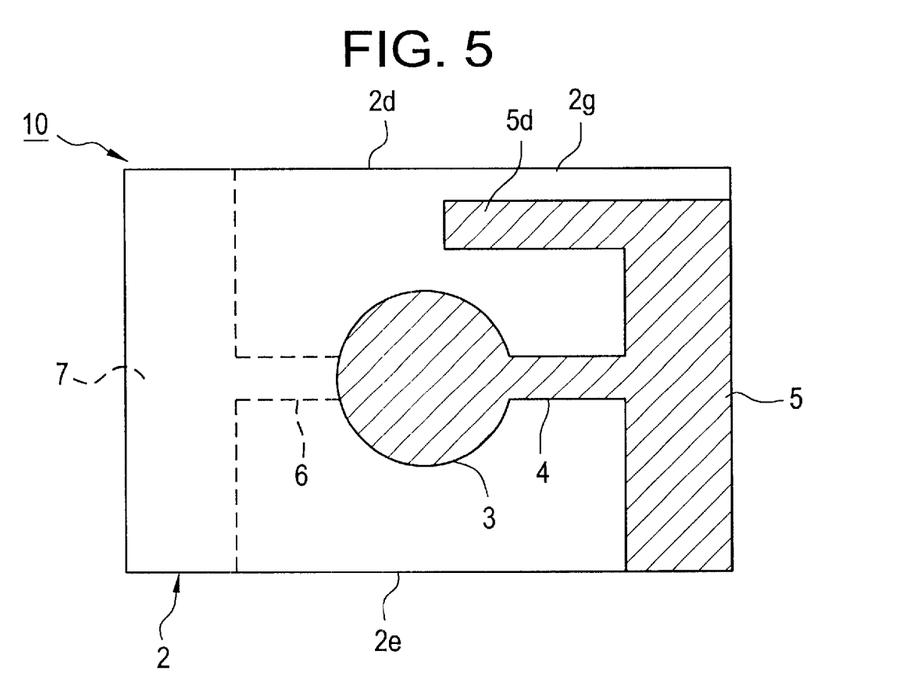
FIG. 5 is a plan view showing still another modified example of the piezoelectric resonator of the first preferred embodiment of the present invention.

In a piezoelectric resonator 10 shown in FIG. 5, the terminal electrode 7 is not provided with an electrode extension portion. In a terminal electrode 5, an electrode extension portion 5d is provided. Here, the terminal electrode 5 is arranged so as not to extend to the edge defined by the side surface 2d and the upper surface 2a. That is, a side gap 2g is provided between the terminal electrode 5 and the edge formed by the side surface 2d and the upper surface 2a. The electrode extension portion 5d is arranged to define this side gap 2g, that is, the electrode extension portion 5d is spaced away from the side surface 2d.

Figure 6:
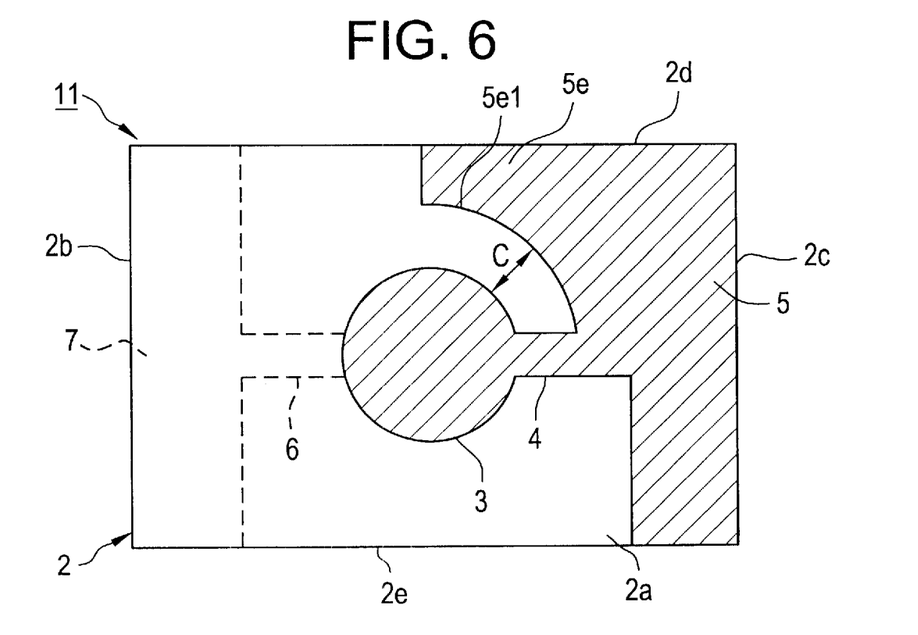
FIG. 6 is a plan view showing a further modified example of the piezoelectric resonator of the first preferred embodiment of the present invention.

In a piezoelectric resonator 11 shown in FIG. 6, an electrode extension portion 5e is provided for the terminal electrode 5.

The electrode extension portions 5e extends along the edge defined by the side surface 2e and the upper surface 2a, and the inside edge of the electrode extension portions 5e has an arc-shape.

Figure 7:
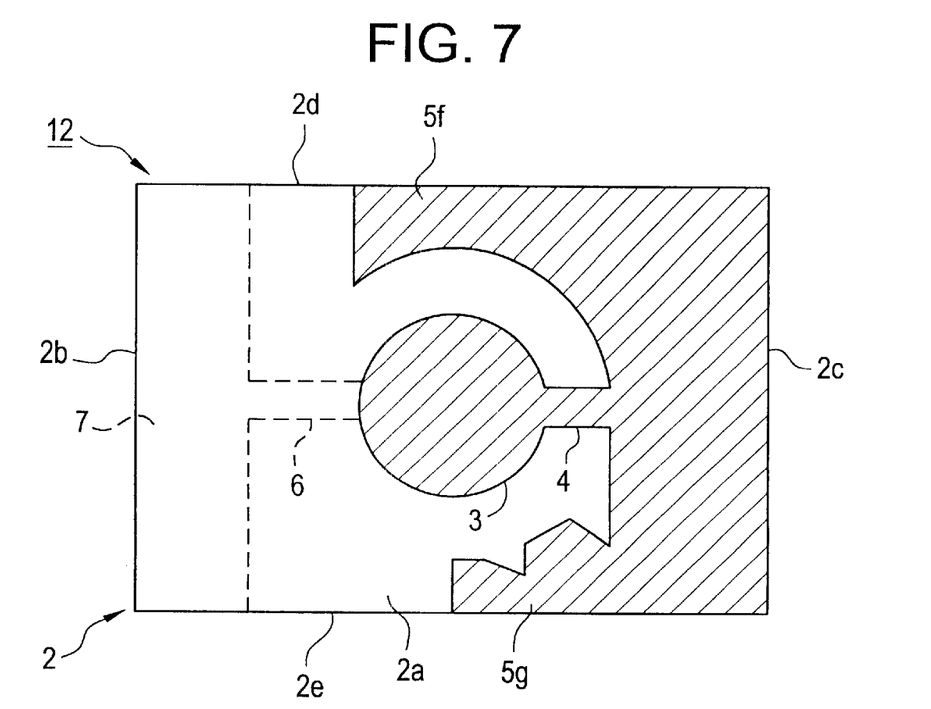
FIG. 7 is a plan view showing another modified example of the piezoelectric resonator of the first preferred embodiment of the present invention.

In a piezoelectric resonator 12 shown in FIG. 7, electrodes 5f and 5g are provided. The electrode extension portions 5f extend along the edge defined by the side surface 2d and the upper surface 2a, and the inside edge of the electrode extension portions 5f constitutes an arc surrounding the excitation electrode 3. The electrode extension portions 5g extends along the edge defined by the side surface 2e and the upper surface 2a, and the inside edge of the electrode extension portions 5g has an irregular shape.

As illustrated in FIGS. 3 through 7, the shape of the electrode extension portion can be appropriately changed as long as it meets the above-described size condition: Y>X.

Next, it will be described that, in the piezoelectric resonator in accordance with first preferred embodiment, it is possible to effectively utilize an intended third harmonic and to effectively suppress width spurious responses when the normal-line distance from the outer peripheral edge of the excitation electrode 3 to the inside edge of the electrode extension portion is not less than about 1.2d, where d is the diameter of the excitation electrode.

For the piezoelectric resonator 11 shown in FIG. 6, excitation electrodes and lead-out electrodes are preferably provided in the same manner as the above-described experimental example, using the same piezoelectric substrate as that of the above-described experimental example. The terminal electrode 7 was, however, provided with no electrode extension portion. The terminal electrode 5 was provided with an electrode extension portion 5e. In this case, various piezoelectric resonators were made by varying the normal-line distance C from the outer peripheral edge of the excitation electrode 3 to the inside edge $5e_1$ of the electrode extension portion 5e. For these piezoelectric resonators, the resonance resistance of the third harmonic of a thickness vertical vibration mode was measured.

Figure 8:
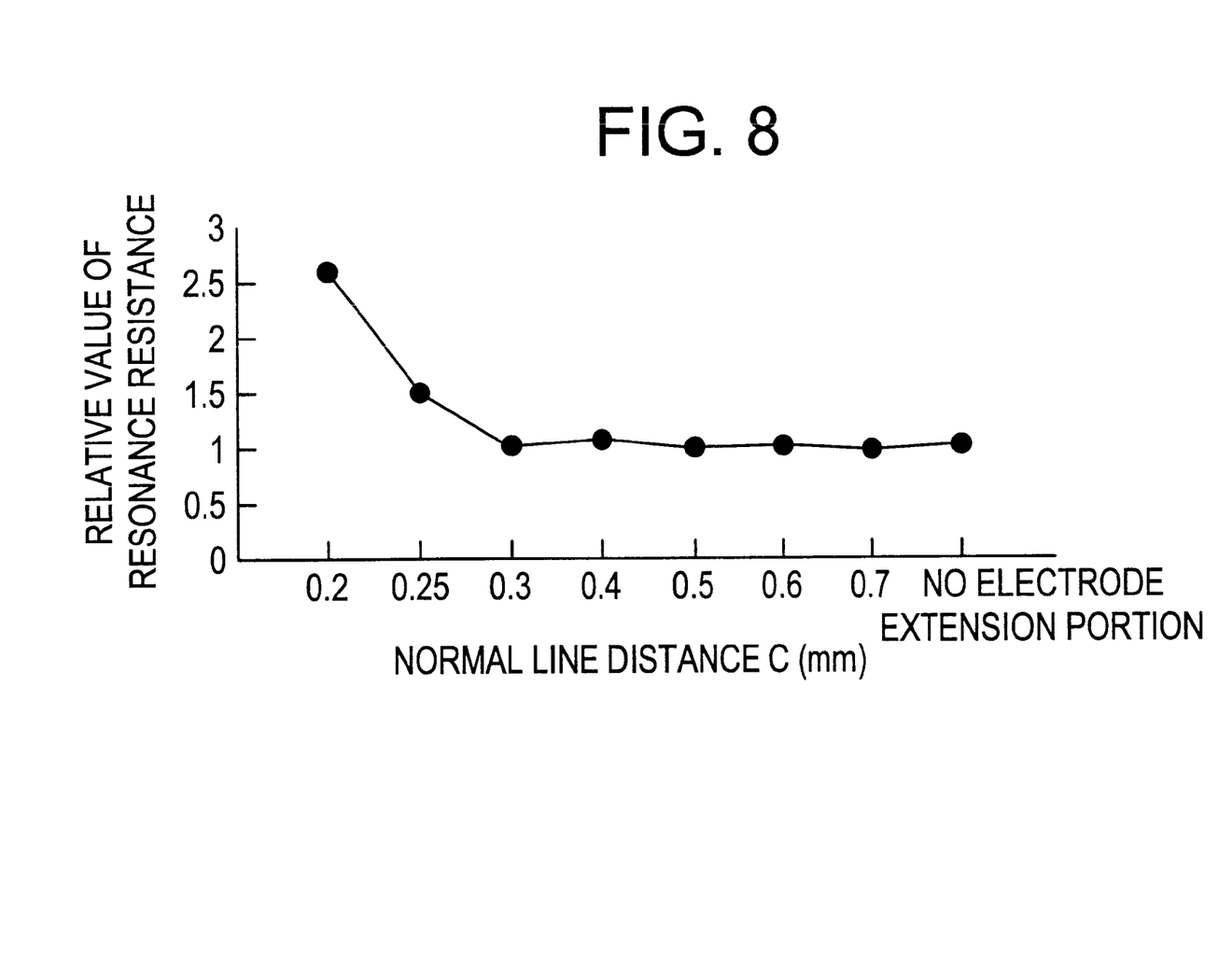
FIG. 8 is a diagram showing the relationship between the normal-line distance C from the outer peripheral edge of the excitation electrode to the inside edge of electrode extension portion and the resonance resistance of desired vibration.

In FIG. 8, the relationship between the above-described normal-line distance C and the resonance resistance of the third harmonic is shown. The resonance resistance of the piezoelectric resonator indicated by "No Electrode Extension Portion" in FIG. 8 represents the resonance resistance of the third harmonic in a piezoelectric resonator without any electrode extension portion. Here, the resonance resistance of the third harmonic in the piezoelectric resonator without any electrode extension portion is about 1, and resonance resistance values of other piezoelectric resonators are shown by relative values.

FIG. 8 shows that, when the normal-line distance C is at least about 0.3 mm, that is, equivalent to at least about 1.2d, the third harmonic is not damped, as in the case where no electrode extension portion is provided. Thus, by setting the normal-line distance from the outer peripheral edge of the excitation electrode to the inside edge of the electrode extension portion to about 1.2d, unwanted vibration is damped without damping intended vibration.

Figure 9:
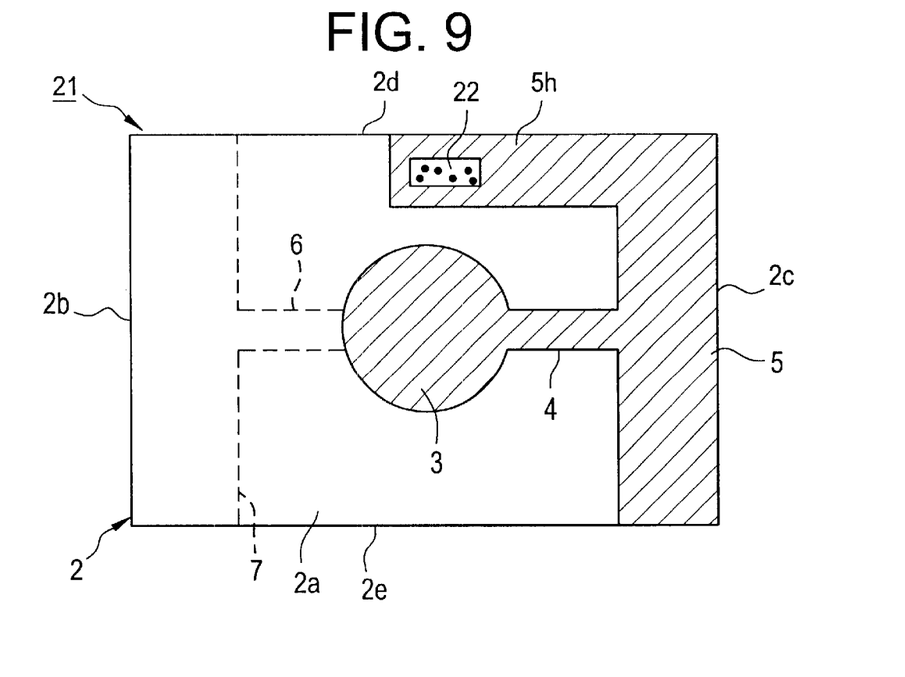
FIG. 9 is a plan view showing the piezoelectric resonator of the second preferred embodiment of the present invention.

In FIG. 9, the piezoelectric resonator in accordance with the second preferred embodiment of the present invention is shown. In a piezoelectric resonator 21, a soldering layer 22 is provided on an electrode extension portion 5h of a terminal electrode 5. A terminal electrode 7 is provided with no electrode extension portion. The piezoelectric resonator 21 is preferably constructed in the same manner as the piezoelectric resonator 1 of the first preferred embodiment except that, the piezoelectric resonator 21 is provided with the soldering layer 22 and the terminal electrode 7 thereof is provided with no electrode extension portion.

In the second preferred embodiment, since the soldering layer 22 is provided on the electrode extension portion 5h, the effect of the added mass of solder allows more effective damping of unwanted vibration.

Figure 10:
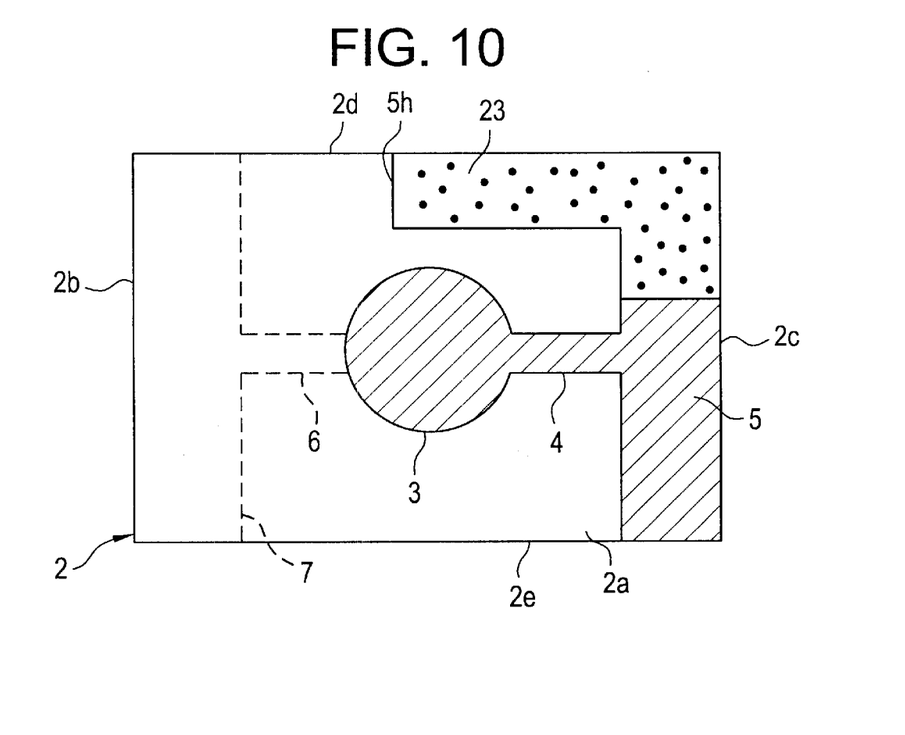
FIG. 10 is a plan view showing a modified example of the piezoelectric resonator of the second preferred embodiment of the present invention.

In FIG. 10, a modified example of the piezoelectric resonator 21 in accordance with the second preferred embodiment is shown. Herein, a soldering layer 23 is provided over the entire region of the electrode extension portion 5h of the terminal electrode 5, and the soldering layer 23 is not only provided over the electrode extension portion 5h, but also provided to extend into the terminal electrode 5 itself. Thus, the soldering layer 23 is not necessarily required to be arranged only at a portion of the electrode extension portion, but the soldering layer 23 may be arranged over the entire surface of the electrode extension portion, and further may be arranged to extend into the terminal electrode. Moreover, although it is not particularly shown in the figure, the soldering layer may be arranged over the entire surface of the terminal electrode.

Figure 11:
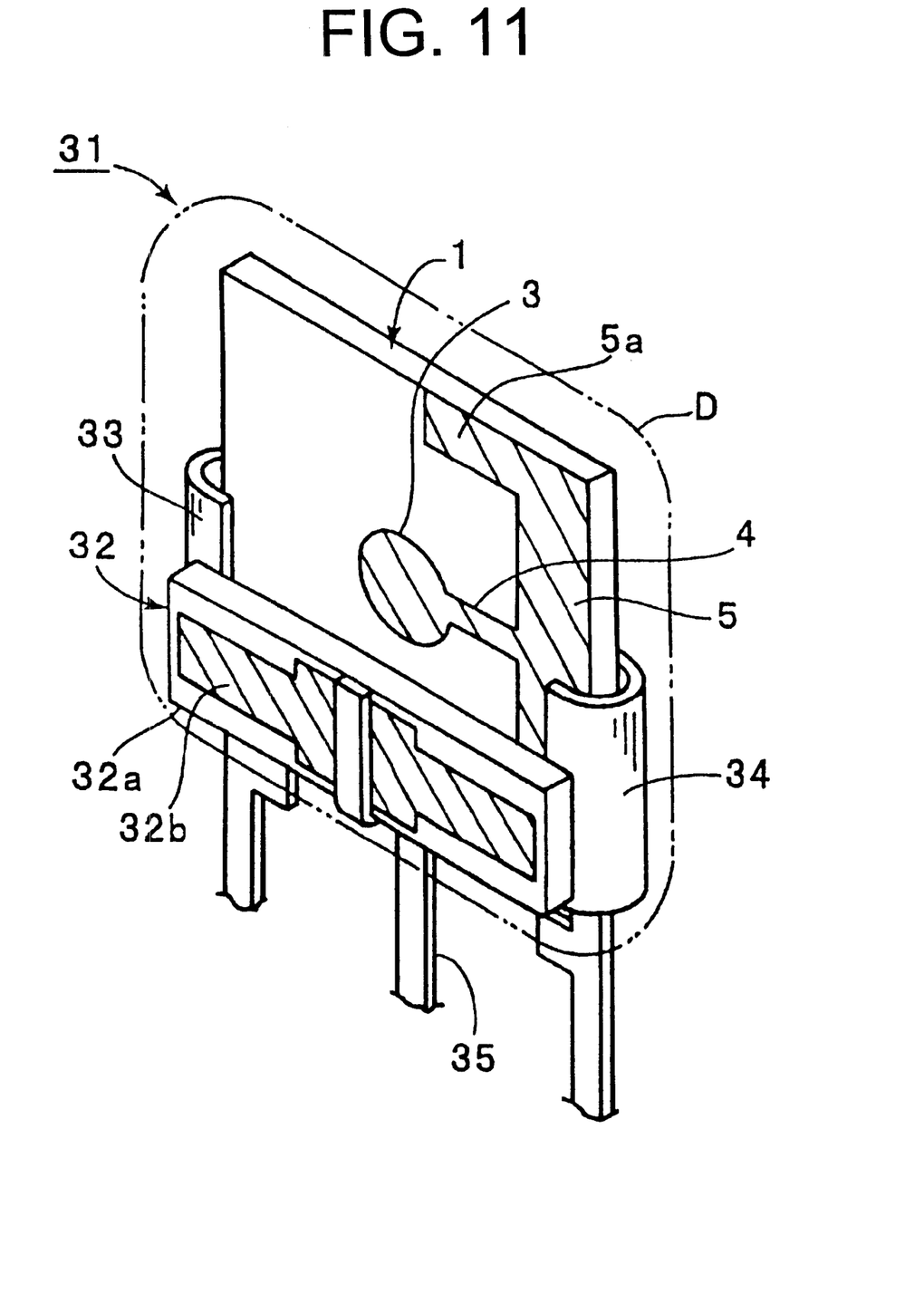
FIG. 11 is a schematic perspective view showing a piezoelectric resonance component with leads using a piezoelectric resonator in accordance with the first embodiment of the present invention.
Figure 12:
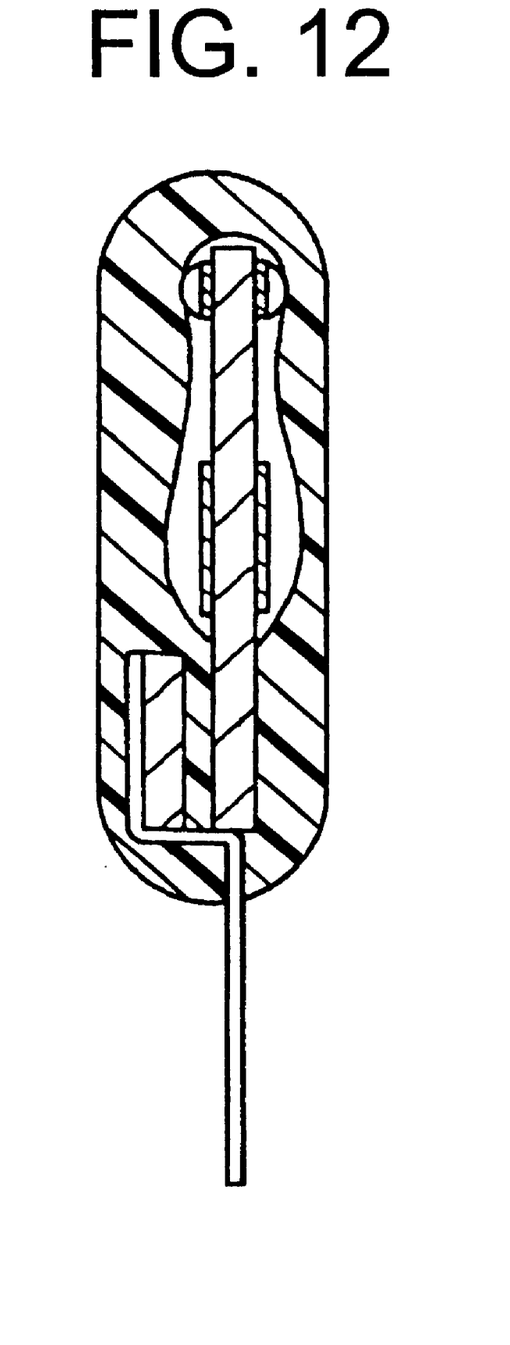
FIG. 12 is a longitudinal sectional view showing a piezoelectric resonance component with leads shown in FIG. 11.

In FIG. 11, an example of a piezoelectric resonance component with leads constructed in accordance with a preferred embodiment of the present invention, is illustrated.

The piezoelectric resonance component 31 preferably includes the piezoelectric resonator 1 of the first preferred embodiment shown in FIG. 1, and a capacitor 32. Lead electrodes 33 and 34 are bonded to the terminal electrode 5 of the piezoelectric resonator 1 and to the terminal electrode on the side not shown in the figure.

The capacitor 32 includes a capacitor electrode 32b provided on one side of a dielectric substrate 32a. On the other side not shown in the figure, a pair of capacitor electrodes are provided so as to overlap with the capacitor electrode 32b. The pair of capacitor electrodes are bonded to the lead terminals 33 and 34, respectively. Also, a lead terminal 35 is bonded to the capacitor electrode 32b.

Here, the portion other than lead-out portion constituted of the lead terminals 33 through 35 is coated with a resin package as shown by a two-dot chain line D in the figure.

The piezoelectric resonance component 31 with leads shown in FIG. 11, therefore, can be used as a load capacitor incorporating piezoelectric resonator.

In addition, the piezoelectric resonator in accordance with various preferred embodiments of the present invention can be applied to chip type piezoelectric resonance components by combining with suitable package material.

As described hereinabove, in the piezoelectric resonator in accordance with preferred embodiments of the present invention, at least one of the first and second terminal electrodes is provided with the above-described electrode extension portion, and therefore unwanted vibration other than a desired vibration mode is effectively suppressed, and resonance characteristics based on desired vibration is effectively utilized. In addition, since the electrode extension portion is formed in the same process as that of the terminal electrode in accordance with an electrode forming method, the electrode extension portion is accurately formed. Also, since the electrode extension portion uses no damping material, such as resin, not only the accuracy of forming it is greatly superior, but the thickness of the piezoelectric resonator is not increased. This allows for further size-reduction of the piezoelectric resonator.

Further, since the same material is used for the electrode material and the electrode extension portion, cracks are not generated when the electrode extension portions are formed nor on the processing line thereafter.

This results in a more easily produced and less expensive piezoelectric resonator.

If the mean normal-line distance from the outer peripheral edge of the excitation electrode to the inside edge of the electrode extension portion is at least about 1.2d, where d is the diameter of the excitation electrode, unwanted damping of intended vibration is reliably suppressed, and the resonance characteristics of the intended vibration is effectively exerted, as can be seen from the above-described experimental examples.

If soldering is provided on the electrode extension portion, the effect of the added mass of solder produces achieve even more effective damping of unwanted vibration. Particularly, if the soldering is provided over the entire upper surface of the terminal electrode, not only is unwanted vibration effectively damped, but also external electrical connections are easily and reliably performed by utilizing the soldering.

If the first and second lead terminals bonded to the respective first and second terminal electrodes by soldering are further provided, it is possible to effectively suppress unwanted vibration in accordance with the present invention, and to provide a piezoelectric resonance component with leads capable of effectively utilizing the resonance characteristics of intended vibration.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. A piezoelectric resonator comprising:

a substantially rectangular piezoelectric substrate having first and second main surfaces;

first and second excitation electrodes partially provided on said first and second main surfaces, respectively, of said piezoelectric substrate, said first and second excitation electrodes being opposed to each other in a central longitudinal portion of the piezoelectric substrate with the piezoelectric substrate being located therebetween;

first and second lead-out electrodes electrically connected to said first and second excitation electrodes, respectively, said first and second lead-out electrodes being provided on the first and second main surface of said piezoelectric substrate, respectively; and first and second terminal electrodes arranged to achieve external connections, said first and second terminal electrodes being provided at end portions of said first and second lead-out electrodes, respectively, said end portions being opposed to an end portion where said respective first and second excitation electrodes are connected;

wherein at least one of said first and second terminal electrodes includes an electrode extension portion arranged to extend in a longitudinal direction of said piezoelectric substrate into the central longitudinal portion of said piezoelectric substrate where said first and second excitation electrodes are located; and a mean normal-line distance from the outer peripheral edge of said excitation electrode to the inside edge of said electrode extension portion is at least about 1.2d, where d is the diameter of said excitation electrode.

2. A piezoelectric resonator as claimed in claim 1, wherein a soldering layer is provided on said electrode extension portion.

3. A piezoelectric resonator as claimed in claim 2, wherein said soldering layer is also arranged over the entire upper surfaces of said first and second terminal electrodes.

4. A piezoelectric resonator as claimed in claim 1, further comprising first and second lead terminals bonded to said respective first and second terminal electrodes.

5. A piezoelectric resonator as claimed in claim 2, wherein said soldering layer is also arranged over a portion of said first and second terminal electrodes.

6. A piezoelectric resonator according to claim 1, wherein said electrode extension portion is spaced from said at least one of the side edges of the piezoelectric substrate.

7. A piezoelectric resonator according to claim 1, wherein said electrode extension portion is positioned along said at least one of the side edges of the piezoelectric substrate.

8. A piezoelectric resonator according to claim 1, wherein said at least one of said first and second terminal electrodes includes another electrode extension portion arranged to extend in the longitudinal direction of said piezoelectric substrate into the central longitudinal portion of said piezoelectric substrate where said first and second excitation electrodes are located.

9. A piezoelectric resonator according to claim 1, wherein said electrode extension portion includes an inner arc shaped edge surrounding the excitation electrode.

10. A piezoelectric resonator according to claim 8, wherein said another electrode extension portion includes an inner irregularly shaped edge.

11. A piezoelectric resonator comprising:

a substantially rectangular piezoelectric substrate having first and second main surfaces;

first and second excitation electrodes partially provided on said first and second main surfaces, respectively, of said piezoelectric substrate, said first and second excitation electrodes being opposed to each other in a central longitudinal portion of the piezoelectric substrate with the piezoelectric substrate being disposed therebetween;

first and second lead-out electrodes electrically connected to said first and second excitation electrodes, respectively, said first and second lead-out electrodes being provided on the first and second main surface of said piezoelectric substrate, respectively; and first and second terminal electrodes connected to said first and second lead-out electrodes;

wherein at least one of said first and second terminal electrodes includes an electrode extension portion which extends in a longitudinal direction of said piezoelectric substrate into the central longitudinal portion of said piezoelectric substrate where said first and second excitation electrodes are located; and a mean normal-line distance from the outer peripheral edge of said excitation electrode to the inside edge of said electrode extension portion is at least about 1.2d, where d is the diameter of said excitation electrode.

12. A piezoelectric resonator as claimed in claim 11, wherein a soldering layer is arranged on said electrode extension portion.

13. A piezoelectric resonator as claimed in claim 12, wherein said soldering layer is also arranged over the entire upper surfaces of said first and second terminal electrodes.

14. A piezoelectric resonator as claimed in claim 11, further comprising first and second lead terminals bonded to said respective first and second terminal electrodes.

15. A piezoelectric resonator as claimed in claim 12, wherein said soldering layer is also arranged over a portion of said first and second terminal electrodes.

16. A piezoelectric resonator according to claim 11, wherein said electrode extension portion is spaced from a side edge of the piezoelectric substrate.

17. A piezoelectric resonator according to claim 11, wherein said electrode extension portion is positioned along a side edge of the piezoelectric substrate.

18. A piezoelectric resonator according to claim 11, wherein said at least one of said first and second terminal electrodes includes another electrode extension portion which extends in the longitudinal direction of said piezoelectric substrate into the central longitudinal portion of said piezoelectric substrate where said first and second excitation electrodes are located.

* * * * *